United States Patent
Warnes

(10) Patent No.: US 7,051,189 B2
(45) Date of Patent: May 23, 2006

(54) METHOD AND APPARATUS FOR PROCESSOR CODE OPTIMIZATION USING CODE COMPRESSION

(75) Inventor: Peter Warnes, London (GB)

(73) Assignee: ARC International, Herts (GB)

( * ) Notice: Subject to any disclaimer, the term of this patent is extended or adjusted under 35 U.S.C. 154(b) by 689 days.

(21) Appl. No.: 09/808,469

(22) Filed: Mar. 14, 2001

(65) Prior Publication Data

US 2002/0013691 A1    Jan. 31, 2002

Related U.S. Application Data

(60) Provisional application No. 60/189,522, filed on Mar. 15, 2000.

(51) Int. Cl.
*G06F 9/30* (2006.01)

(52) U.S. Cl. ...................... 712/210; 717/151
(58) Field of Classification Search ............... 717/151; 712/210

See application file for complete search history.

(56) References Cited

U.S. PATENT DOCUMENTS

| | | | |
|---|---|---|---|
| 5,361,373 A * | 11/1994 | Gilson | 712/1 |
| 5,418,976 A * | 5/1995 | Iida | 712/38 |
| 5,463,746 A | 10/1995 | Brodnax et al. | |
| 5,493,508 A | 2/1996 | Dangelo et al. | |
| 5,535,331 A | 7/1996 | Swoboda et al. | |
| 5,544,067 A | 8/1996 | Rostoker et al. | |
| 5,555,201 A | 9/1996 | Dangelo et al. | |
| 5,748,650 A | 5/1998 | Blaker et al. | |
| 5,764,994 A | 6/1998 | Craft | |
| 5,794,010 A | 8/1998 | Worrell et al. | |
| 5,801,958 A | 9/1998 | Dangelo et al. | |
| 5,812,416 A | 9/1998 | Gupte et al. | |
| 5,819,058 A | 10/1998 | Miller et al. | |
| 5,819,097 A * | 10/1998 | Brooks et al. | 717/141 |
| 5,848,255 A | 12/1998 | Kondo | |
| 5,867,399 A | 2/1999 | Rostoker et al. | |
| 5,867,681 A | 2/1999 | Worrell et al. | |
| 5,878,267 A * | 3/1999 | Hampapuram et al. | 712/24 |

(Continued)

FOREIGN PATENT DOCUMENTS

EP    0 843 253 A1    5/1998

(Continued)

OTHER PUBLICATIONS

Araujo, Guido, Sudarsanam, Ashok, Malik, Sharad, "Insruction Set Design and Optimizations for Address Computation in DSP Architectures", p. 102-107, 1996 IEEE, retrieved from ACM Portal Apr. 26, 2004.*

(Continued)

*Primary Examiner*—Wei Zhen
*Assistant Examiner*—Mary Steelman
(74) *Attorney, Agent, or Firm*—Gazdzinski & Associates

(57) ABSTRACT

An improved method of optimizing the instruction set of a digital processor using code compression. In one embodiment, the method comprises obtaining an assembly language program to be used for the optimization process; calculating the static frequency of each instruction type from the base instruction set; sorting the instruction types by frequency; determining the number and type of instructions necessary for correct program execution; creating a compressed instruction set encoding; re-evaluating the compressed instruction according to the foregoing steps; and generating an instruction set encoding for the compressed instruction set. Improved compressed instruction formats and register structures useful in a processor are also disclosed. A computer program and apparatus for synthesizing logic implementing the aforementioned data cache architecture and pipeline performance enhancements are further disclosed.

37 Claims, 11 Drawing Sheets

U.S. PATENT DOCUMENTS

| | | | |
|---|---|---|---|
| 5,884,057 A | 3/1999 | Blomgren et al. | |
| 5,896,519 A | 4/1999 | Worrell | |
| 5,901,310 A | 5/1999 | Rahman et al. | |
| 5,905,893 A | 5/1999 | Worrell | |
| 6,032,170 A * | 2/2000 | Guttag et al. | 708/620 |
| 6,101,592 A * | 8/2000 | Pechanek et al. | 712/20 |
| 6,173,434 B1 | 1/2001 | Wirthlin et al. | |
| 6,195,743 B1 | 2/2001 | Elnozahy | |
| 6,223,274 B1* | 4/2001 | Catthoor et al. | 712/34 |
| 6,233,674 B1 | 5/2001 | Elnozahy | |
| 6,237,080 B1 | 5/2001 | Makinen | |
| 6,263,429 B1 | 7/2001 | Siska | |
| 6,266,807 B1* | 7/2001 | McGarity et al. | 717/148 |
| 6,268,809 B1 | 7/2001 | Saito | |
| 6,275,921 B1 | 8/2001 | Iwata et al. | |
| 6,324,678 B1 | 11/2001 | Dangelo et al. | |
| 6,378,123 B1 | 4/2002 | Dupenloup | |
| 6,408,382 B1* | 6/2002 | Pechanek et al. | 712/227 |
| 6,408,428 B1* | 6/2002 | Schlansker et al. | 716/17 |
| 6,421,818 B1 | 7/2002 | Dupenloup et al. | |
| 6,457,173 B1* | 9/2002 | Gupta et al. | 717/149 |
| 6,477,683 B1* | 11/2002 | Killian et al. | 716/1 |
| 6,477,697 B1* | 11/2002 | Killian et al. | 716/18 |
| 6,587,939 B1* | 7/2003 | Takano | 712/210 |
| 6,651,160 B1* | 11/2003 | Hays | 712/210 |
| 6,701,515 B1* | 3/2004 | Wilson et al. | 717/117 |
| 6,760,888 B1 | 7/2004 | Killian et al. | |
| 6,862,563 B1 | 3/2005 | Hakewill et al. | |
| 2002/0013691 A1* | 1/2002 | Warnes | 703/22 |

FOREIGN PATENT DOCUMENTS

| | | |
|---|---|---|
| EP | 1 050 798 A1 | 5/1999 |
| GB | 2 308 470 | 6/1997 |
| WO | WO 97 13209 A | 4/1997 |
| WO | WO 00/29938 | 5/2000 |

OTHER PUBLICATIONS

Araujo, Guido, and Malik, Sharad, "Optimal Code Generation for Embedded/Memory Non-Homogeneous Register Architectures", p. 36-41, 1995 ACM, retrieved from IEE database Apr. 26, 2004.*

Holmer, Bruce K., Despain, Alvin M., "Viewing Instruction Set Design as an Optimization Problem", p. 153-162, 1991 ACM, retrieved from ACM Portal database 04/26/204.*

Liao, Stan Y., Devadas, Srinivas, Keutzer, Kurt, "Code Density Optimization for Embedded DSP Processors Using Data Compression Techniques", p. 272-285, 1995 IEEE, retrieved from IEEE database Apr. 26, 2004.*

Lefugry, Charles, et al. (1999) "Evaluation of a High Performance Code Compression Method," IEEE—Proceedings of Micro 32 (consisting of 10 pages).

U.S. Appl. No. 09/418,663 entitled "Method and Apparatus for Managing the Configuration and Functionality of a Semiconductor Design," filed Oct. 14, 1999.

Berekovic, et al., (Oct. 1998), "A Core Generator for Fully Synthesizable and Highly Parameterizable RISC-Cores for System-On-Chip Designs," IEEE Workshop on Signal Processing Systems. SIPS. Design and Implementation, pp. 561-568, XP002137267.

Karl Guttag (Mar. 1983), "μP's on-chip macrocode extends instruction set," Electronic Design, vol. 31, No. 5, pp. 157-161.

Dolle, et al., (Jul. 1997), "A 32-b RISC/DSP Microprocessor with Reduced Complexity," IEEE Journal of Solid-State Circuits, IEEE Inc., New York, vol. 32, No. 7, pp. 1056-1066, XP000729365.

Elms, A., "Tuning a Customisable RISC Core for DSP", Electronic Product Design, Sep. 1997, vol. 18, No. 9, pp. 19-20, 22, XP000909039.

Tensilica, Inc; Xtensa Instruction Set Architecture (ISA) Reference Manual Revision 1.0. (First 25 pages).

Tensilica, Inc. Instruction Extension Language (TIE) Reference Manual Revision 1.3.

Compton et al., "Configurable Computing: A Survey of Systems and Software," Technical Report, Northwestern University, Dept. of ECE, 1999.

Yang, Jin-Hyuk, et al., "MetaCore: A Configurable & Instruction-Level Extensible DSP Core," Proceedings of the ASP-DAC '98 Asian and South Pacific Design Automation Conference 1998. pp. 325-326, XP-002137268.

* cited by examiner

| 13 | 12 | 11 | 10 9 8 | 7 6 5 4 3 2 1 0 |
|---|---|---|---|---|
| 0 | 0 | 0 | cc | 8 bit signed offset |

Fig. 4

| 13 | 12 | 11 | 10 9 8 | 7 6 5 | 4 3 2 1 0 |
|---|---|---|---|---|---|
| 0 | 0 | 1 | a | b | op |

Fig. 5

| 13 | 12 | 11 | 10 9 8 | 7 6 5 | 4 3 2 1 0 |
|---|---|---|---|---|---|
| 0 | 0 | 1 | a | subop | op=31 |

Fig. 6

| 13 | 12 | 11 | 10 9 8 | 7 6 5 | 4 3 2 1 0 |
|---|---|---|---|---|---|
| 0 | 0 | 1 | Imp_op | subop=7 | op=31 |

Fig. 7

| 13 | 12 | 11 | 10 9 8 | 7 6 5 | 4 3 | 2 1 0 |
|---|---|---|---|---|---|---|
| 0 | 1 | 0 | A | b | op | 4 bit offset |

Fig. 8

| 13 | 12 | 11 | 10 9 8 | 7 6 5 | 4 | 3 2 1 0 |
|---|---|---|---|---|---|---|
| 0 | 1 | 1 | A | b | op | 4 bit offset |

Fig. 9

| 13 | 12 | 11 | 10 9 8 | 7 | 6 5 4 3 2 1 0 |
|---|---|---|---|---|---|
| 1 | 0 | 0 | A | op | 7 bit offset |

Fig. 10

| 13 | 12 | 11 | 10 9 8 | 7 | 6 5 4 3 2 1 0 |
|---|---|---|---|---|---|
| 1 | 0 | 1 | A | op | 7 bit integer |

Fig. 11

| 13 | 12 | 11 | 10 9 8 7 6 5 | op | 5 bit integer |
|---|---|---|---|---|---|
| 1 | 1 | 0 | A | op | 5 bit integer |

Fig. 12

| 13 | 12 | 11 | 10 9 8 | 7 6 5 4 3 | 2 1 0 |
|---|---|---|---|---|---|
| 1 | 1 | 1 | a | h | op |

Fig. 13

| 14 | 13 | 12 | 11 | 10 9 8 | 7 6 5 4 3 2 1 0 |
|---|---|---|---|---|---|
| 0 | 0 | 0 | 0 | cc | 8 bit signed offset |

Fig. 14

| 14 | 13 | 12 | 11 | 10 9 8 | 7 6 5 | 4 3 2 1 0 |
|---|---|---|---|---|---|---|
| 0 | 0 | 0 | 1 | a | b | op |

Fig. 15

| 14 | 13 | 12 | 11 | 10 9 8 | 7 6 5 | 4 3 2 1 0 |
|---|---|---|---|---|---|---|
| 0 | 0 | 0 | 1 | a | subop | op=31 |

Fig. 16

| 14 | 13 | 12 | 11 | 10 9 8 | 7 6 5 | 4 3 2 1 0 |
|---|---|---|---|---|---|---|
| 0 | 0 | 0 | 1 | imp_op | subop=7 | op=31 |

Fig. 17

| 13 | 12 | 11 | 10 | 9 8 7 | 6 5 | 4 3 2 1 0 |
|---|---|---|---|---|---|---|
| 0 | 0 | 1 | 0 | a | b | 5 bit offset |

Fig. 18

| 13 | 12 | 11 | 10 | 9 | 8 | 7 | 6 | 5 | 4 | 3 | 2 | 1 | 0 |
|---|---|---|---|---|---|---|---|---|---|---|---|---|---|
| 0 | 0 | 1 | 1 | \multicolumn{3}{c|}{a} | \multicolumn{3}{c|}{b} | \multicolumn{4}{c|}{5 bit offset} |

Fig. 19

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 0 | 1 | 0 | 0 | \multicolumn{3}{c|}{a} | op | \multicolumn{6}{c|}{7 bit offset} |

Fig. 20

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 0 | 1 | 0 | 1 | \multicolumn{3}{c|}{a} | op | \multicolumn{6}{c|}{7 bit integer} |

Fig. 21

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 0 | 1 | 1 | 0 | \multicolumn{3}{c|}{a} | \multicolumn{3}{c|}{op} | \multicolumn{5}{c|}{5 bit integer} |

Fig. 22

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 0 | 1 | 1 | 1 | a | | | h | | | | | op | | |

Fig. 23

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 1 | 0 | 0 | 0 | a | | | b | | | 0 | op | | c | |

Fig. 24

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 1 | 0 | 0 | 0 | a | | | b | | | 1 | op | | 3 bit int | | |

Fig. 25

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 1 | 0 | 0 | 1 | a | | | op | | 7 bit integer | | | | | |

Fig. 26

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| 1 | 0 | 1 | 0 | a | | | b | | | op | | 4 bit offset | | |

Fig. 27

METHOD AND APPARATUS FOR PROCESSOR CODE OPTIMIZATION USING CODE COMPRESSION

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

PRIORITY

This application claims priority to U.S. provisional patent application Ser. No. 60/189,522, filed Mar. 15, 2000 and entitled "Method and Apparatus for Processor Code Optimization Using Code Compression."

RELATED APPLICATIONS

This application is related to pending U.S. patent application Ser. No. 09/418,663, filed Oct. 14, 1999 entitled "Method and Apparatus for Managing the Configuration and Functionality of a Semi-Conductor Design", which claims priority benefit of U.S. provisional patent application Ser. No. 60/104,271, filed Oct. 14, 1998, of the same title.

COMPUTER PROGRAM APPENDICES

Appendices I–XII filed herewith on two identical compact discs (Copy 1 and Copy 2 ), each disc containing twelve (12) computer files comprising a part of the specification pursuant to 37 CFR 1.77 and 1.96. Each compact disc contains twelve (12) ASCII text files reproduced on Jul. 29, 2004 and having the following names and file sizes: APPENDIX I-1 kb; APPENDIX II-1 kb; APPENDIX III-18 kb; APPENDIX IV-1 kb; APPENDIX V-1 kb; APPENDIX VI-1 kb; APPENDIX VII-1 kb; APPENDIX VIII-2 kb; APPENDIX IX-1 kb; APPENDIX X-1 kb; APPENDIX XI-1 kb; and APPENDIX XII-3 kb. The entirety of the computer files contained in these compact discs is incorporated by reference herein.

BACKGROUND OF THE INVENTION

1. Field of the Invention

The present invention relates to the field of integrated circuit design, specifically to the use of optimized instruction sets within a pipelined central processing unit (CPU) or user-customizable microprocessor.

2. Description of Related Technology

RISC (or reduced instruction set computer) processors are well known in the computing arts. RISC processors generally have the fundamental characteristic of utilizing a substantially reduced instruction set as compared to non-RISC (commonly known as "CISC") processors. Typically, RISC processor machine instructions are not all micro-coded, but rather may be executed immediately without decoding, thereby affording significant economies in terms of processing speed. This "streamlined" instruction handling capability furthermore allows even greater simplicity in the design of the processor (as compared to non-RISC devices), thereby allowing smaller silicon and reduced cost of fabrication.

RISC processors are also typically characterized by (i) load/store memory architecture (i.e., only the load and store instructions have access to memory; other instructions operate via internal registers within the processor); (ii) unity of processor and compiler; and (iii) pipelining. RISC processors typically enjoy relatively high performance due to their simplicity of design. But RISC processors also sometimes suffer from a larger program size as compared to CISC processors. Since a RISC processor employs a reduced number of instructions and more limited addressing modes as compared to a CISC processor, it is common for programs targeted for a RISC processor will be larger than one targeted for a CISC processor. This fact is a consequence of requiring additional instructions to do the same function. For example, a RISC processor lacking a multiply-accumulate instruction with auto-indexing addressing modes will require two instructions to implement the multiply-accumulate and four instructions to implement the addressing modes. A CISC processor that includes this instruction will perform the operation in a single instruction.

Compressing the instruction set of a RISC processor (particularly in the case of an embedded applications such as consumer electronics) is important for reasons relating to memory and die space limitations, as well as others. A number of varying compression techniques have been proposed to reduce instruction set size. However, increased instruction set compression carries an accompanying performance loss, due to any number of factors including (i) the need to "decompress" the instructions before execution; (ii) reduced clock frequency through the extra hardware added to support the code compression; and (iii) an increased number of unused clock cycles by the compressed instructions (e.g., unused delay slots that would otherwise be used by the non-compressed analogs of the compressed instructions). The common metric for measuring compression is compression ratio (CR), which is defined generally by the formula:

$$CR = \text{compressed size/original size} \qquad (\text{Eqn. 1})$$

In the typical RISC device, the designer may generally choose from either 16-bit or 32-bit instructions. Sixteen-bit instructions are more restricted in functionality than 32-bit instructions, which generally causes the number of instructions executed in the 16-bit instruction programs to increase comparatively. However, 16-bit instructions may generally also be fetched more efficiently, thereby creating a trade-off with the increased execution time of the greater number of 16-bit instructions. The THUMB® approach of ARM is an example of such a 16-bit instruction set. Programs compiled for THUMB achieve roughly 30% smaller (as compared to the standard ARM processor instruction set), but also run on the order of 15%–20% slower on systems with 32-bit buses and no wait states. See, e.g., "*Evaluation of a High Performance Code Compression Method*", C. Lefurgy, et al, University of Michigan (1999).

Another prior art approach, sometimes referred to as "CCRP", is to specifically modify the instruction cache to run compressed programs. At the time of program compiling, the cache code lines are compressed using any number of different coding schemes (e.g., 48-bit segments compressed using Huffman codes) and stored in the processor main memory. At run-time, the cache lines are fetched from the main memory, decompressed, and loaded into the instruction cache. Accordingly, using this scheme, instructions fetched from the instruction cache are in decompressed form, and have the same addresses as those in the original program. This approach has the benefit of obviating most all modification to the core in support of the compression.

However, one significant drawback relates to cache "misses" (i.e., a request to read from memory which cannot be satisfied from cache, for which the main memory must be accessed); such missed instructions do not reside at the same address in memory, and accordingly the processor must correlate or map missed instruction cache addresses to the main memory addresses where the compressed code is stored.

A somewhat similar technique known as "Codepack" (employed primarily by IBM Corporation) utilizes a separate logic mapping unit to map between the native instruction set addresses and the compressed instruction set addresses. The decompression unit accepts L1-cache (i.e., primary or on-chip cache) miss addresses, and subsequently retrieves the corresponding compressed instruction bytes from the main memory. The retrieved compressed bytes are decompressed and subsequently provides the native (decompressed) instructions to the L1-cache for use thereafter. It has been reported that such techniques may result in a compression level of 60% with a performance degradation on the order of 10% of the native program.

In "Codepack", each 32-bit instruction word is first divided into 16-bit high and low half-words. These two half-words are then translated into a variable-length bit codeword (e.g., length ranging from 2 to 11 bits). Codepack uses two separate dictionaries for the aforementioned translation to the variable bit codewords, since half-words may have different values, and also distribution frequencies (i.e., some much more likely than others). Furthermore, the more commonly used half-word values are assigned shorter codewords. The codewords are divided into 2 sections; the first being a 2- or 3-bit tag indicative of codeword size, and a second section for indexing the translation dictionaries. The value "0" occurring in the lower half-word is encoded using only a 2-bit tag (no low index bits) based on its comparatively high frequency of occurrence. The dictionaries are fixed at time of program loading, and may be adapted for use with specific programs. Half-words not present within the dictionaries are annotated with a 3-bit marker to identify them as not being compressed bytes.

Each group of 16 instructions is combined into a so-called "compression block." The whole compression block is fetched and decompressed if a requested instruction cache line (8 instructions) is present within the block. Note that the compressed instructions are stored at different memory locations from the non-compressed native instructions. The instruction address from the cache miss is mapped to the corresponding compressed instruction address by correlation table which is created during the compression of the instructions; each index is 32-bits long in the IBM processor. Furthermore, each entry in the correlation table maps one compression group, each compression group comprising two compression "blocks" (32 instructions in total). The first compression block of 16 instructions is specified as a byte offset into the compressed memory, while the second block is specified using a different offset from the first block.

While good overall performance (i.e., high compression ratio and low percentage loss of performance may be achieved, one of the more significant drawbacks of both CCRP and "Codepack" prior art methods described above is the increased complexity associated with compressed instruction decode. This complexity manifests itself in, among other things, the need for additional decompression, address mapping, and translation logic (as well as codeword "dictionaries" in the case of Codepack), thereby increasing the complexity and cost of any RISC design incorporating these features.

Based on the foregoing, there is a need for an improved method and apparatus for compressing the instruction sets of RISC (and other) processors, while not significantly sacrificing the benefits inherent in the design of the processor. Such improved apparatus and method would ideally result in significant compression of the base instruction set, require no processor mode switching between pure 32-bit instruction mode execution and pure 16-bit instruction mode execution, utilize comparatively simple instruction decode logic, allow for normal operation of existing exceptions/interrupts and call/return functions within the core, add no restrictions to program address range, and result in only a very small loss (i.e., on the order of 10% or less) of overall performance resulting from reduced clock frequency and other factors.

SUMMARY OF THE INVENTION

In a first aspect of the invention, an improved method of optimizing a processor instruction set using code compression is disclosed. In one embodiment, the method comprises obtaining an assembly language program to be used for the optimization process; calculating the static frequency of each instruction type from the base instruction set; sorting the instruction types by frequency; determining the number and type of instructions necessary for correct program execution; creating a compressed instruction set encoding; re-evaluating the compressed instruction according to the foregoing steps; and generating an instruction set encoding for the compressed instruction set.

In a second aspect of the invention, an improved compressed instruction format useful in a digital processor is disclosed. In one embodiment, the compressed format comprises two paired 14-bit instruction words (ISA1). In a second embodiment, a 15-bit ISA2 format is disclosed.

In a third aspect of the invention, an improved storage device having the compressed processor instruction set described above is disclosed. In a first embodiment, the improved storage device comprises a random access memory (RAM) or read-only memory (ROM) having all or a portion of the compressed instruction set stored therein for subsequent access by a processor core. In a second embodiment, the storage device comprises a magnetic medium such as a floppy disk or magnetic tape spool having an object code representation of a computer program incorporating compressed instructions disposed thereon.

In a fourth aspect of the invention, an improved method of synthesizing the design of an integrated circuit incorporating the aforementioned compressed instruction set is disclosed. In one exemplary embodiment, the method comprises obtaining user input regarding the design and instruction set configuration; creating a customized HDL functional block description based on the user input and existing libraries of functions; determining a design hierarchy based on the user input and existing libraries; running a makefile to create the structural HDL and script; running the script to create a makefile for the simulator and a synthesis script; and synthesizing and/or simulating the design from the simulation makefile or synthesis script, respectively.

In a fifth aspect of the invention, an improved computer program useful for synthesizing processor designs and embodying the aforementioned compressed instruction set and instruction format(s) is disclosed. In one exemplary embodiment, the computer program comprises an object code representation stored on the magnetic storage device of a microcomputer, and adapted to run on the central processing unit thereof. The computer program further comprises an interactive, menu-driven graphical user interface (GUI), thereby facilitating ease of use.

In a sixth aspect of the invention, an improved apparatus for running the aforementioned synthesis program is disclosed. In one exemplary embodiment, the system comprises a stand-alone microcomputer system having a display, central processing unit, data storage device(s), and input device.

In a seventh aspect of the invention, an improved processor architecture utilizing the foregoing optimized and compressed instruction set is disclosed. In one exemplary embodiment, the processor comprises an extensible reduced instruction set computer (RISC) having a four stage pipeline.

BRIEF DESCRIPTION OF THE DRAWINGS

FIG. 4 is a graphical representation of an exemplary 8-bit signed offset, 14-bit conditional branch instruction encoding according to the invention.

FIG. 5 is a graphical representation of an exemplary register-register multi-use opcode (CMP/ ADD.F/ SUB.F/ AND.F/ OR.F/ XOR.F/ ASL.F/ LSR.F/ ASR.F/ MUL64.F/ MULU64.F/ EXTB.F/ EXTW.F/ SEXB.F/ SEXW.F/ NEG.F/ NOT.F/ MOV/ ADD/ SUB/ ASL) 14-bit instruction encoding according to the invention.

FIG. 6 is a graphical representation of an exemplary single source register opcode (Single_op a) 14-bit instruction encoding according to the invention.

FIG. 7 is a graphical representation of an exemplary implied register opcode 14-bit instruction encoding according to the invention.

FIG. 8 is a graphical representation of an exemplary 4-bit offset, 14-bit LD/LDB/LDW instruction encoding according to the invention.

FIG. 9 is a graphical representation of an exemplary 4-bit offset, 14-bit ST/STB instruction encoding according to the invention.

FIG. 10 is a graphical representation of an exemplary 7-bit offset, 14-bit LOAD/STORE instruction encoding according to the invention.

FIG. 11 is a graphical representation of an exemplary 7-bit integer, 14-bit MOVE/COMPARE instruction encoding according to the invention.

FIG. 12 is a graphical representation of an exemplary 5-bit integer, 14-bit ADD.F/ SUB.F/ ASL.F/ ASR.F/ LSR.F instruction encoding according to the invention.

FIG. 13 is a graphical representation of an exemplary 14-bit MOV.F/ CMP/ADD.F instruction encoding according to the invention.

FIG. 14 is a graphical representation of an exemplary 8-bit signed offset conditional branch, 15-bit instruction encoding according to the invention.

FIG. 15 is a graphical representation of an exemplary 15-bit register-register multi-use opcode AND.F/ OR.F/ XOR.F/ ASL.F/ LSR.F/ ASR.F/ MUL64.F/ MULU64.F/ EXTB.F/ EXTW.F/ SEXB.F/ SEXW.F/ NEG.F/ NOT.F/ MOV/ ADD/ SUB/ ASL/ instruction encoding according to the invention.

FIG. 16 is a graphical representation of an exemplary 15-bit single source register opcode (Single op) instruction encoding according to the invention.

FIG. 17 is a graphical representation of an exemplary 15-bit implied opcode (Implied op) instruction encoding according to the invention.

FIG. 18 is a graphical representation of an exemplary 5-bit offset, 15-bit LOAD instruction encoding according to the invention.

FIG. 19 is a graphical representation of an exemplary 5-bit offset, 15-bit STORE instruction encoding according to the invention.

FIG. 20 is a graphical representation of an exemplary 7-bit offset, 15-bit LOAD/ STORE instruction encoding according to the invention.

FIG. 21 is a graphical representation of an exemplary 7-bit integer, 15-bit MOV/ CMP instruction encoding according to the invention.

FIG. 22 is a graphical representation of an exemplary 5-bit integer, ASL.F/ ASR.F/ LSR.F 15-bit instruction encoding according to the invention.

FIG. 23 is a graphical representation of an exemplary 15-bit MOV.F instruction encoding according to the invention.

FIG. 24 is a graphical representation of an exemplary 15-bit ADD.F/ SUB.F instruction encoding according to the invention.

FIG. 25 is a graphical representation of an exemplary 3-bit integer, 15-bit ADD.F/ SUB.F instruction encoding according to the invention.

FIG. 26 is a graphical representation of an exemplary 7-bit integer, 15-bit ADD.F/ SUB.F instruction encoding according to the invention.

FIG. 27 is a graphical representation of an exemplary 4-bit offset, 15-bit LDB/ LDW instruction encoding according to the invention.

DETAILED DESCRIPTION

Figure 1:
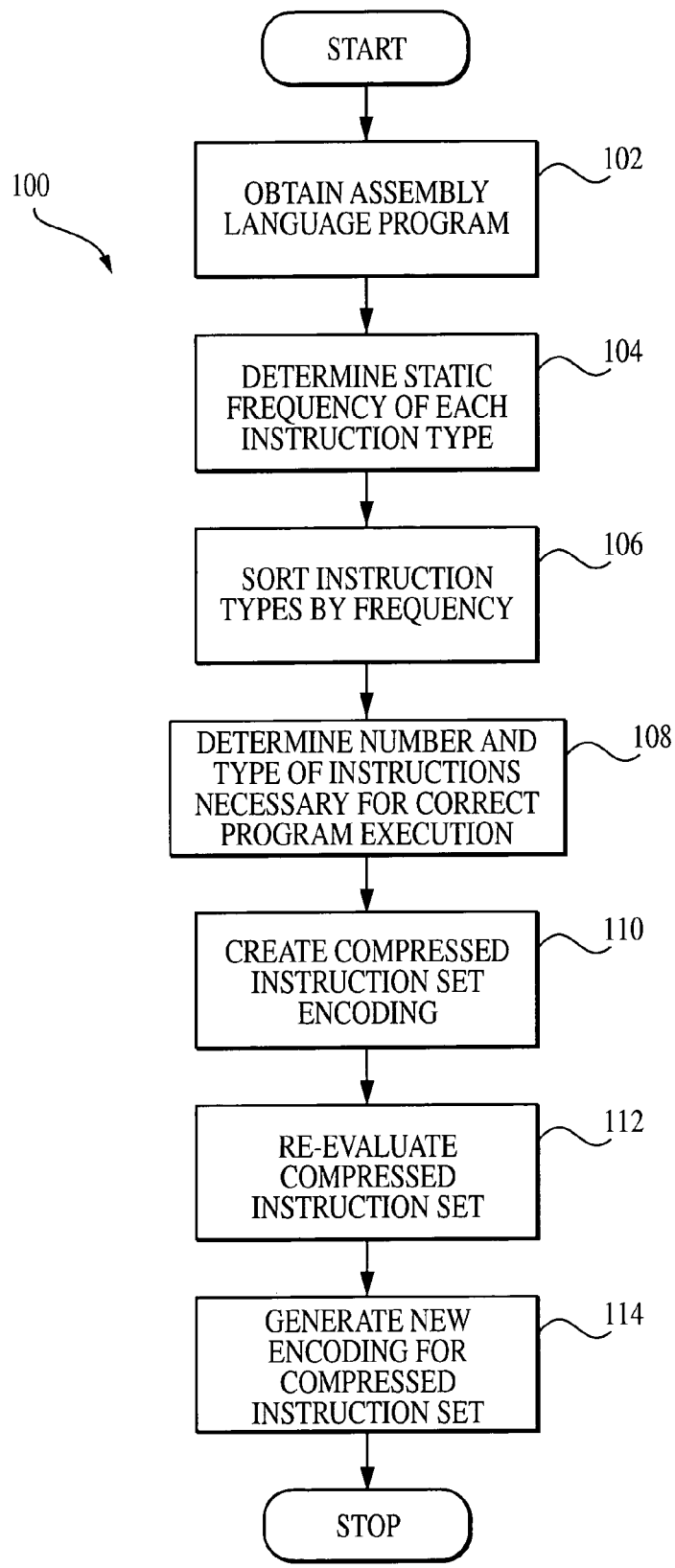
FIG. 1 is logical block diagram illustrating one embodiment of the method of optimizing an instruction set using code compression according to the present invention.

Reference is now made to the drawings wherein like numerals refer to like parts throughout.

As used herein, the term "processor" is meant to include any integrated circuit or other electronic device capable of performing an operation on at least one instruction word including, without limitation, reduced instruction set core (RISC) processors such as the ARC™ user-configurable and extensible core manufactured by the Assignee hereof, central processing units (CPUs), and digital signal processors (DSPs). The hardware of such devices may be integrated onto a single piece of silicon ("die"), or distributed among two or more die. Furthermore, various functional aspects of the processor may be implemented solely as software or firmware associated with the processor.

Additionally, it will be recognized by those of ordinary skill in the art that the term "stage" as used herein refers to various successive stages within a pipelined processor; i.e., stage 1 refers to the first pipelined stage, stage 2 to the second pipelined stage, and so forth.

It is also noted that while the following description is cast in terms of VHSIC hardware description language (VHDL), other hardware description languages such as Verilog® may be used to describe various embodiments of the invention with equal success. Furthermore, while an exemplary Synopsys® synthesis engine such as the Design Compiler 2000.05 (DC00) is used to synthesize the various embodiments set forth herein, other synthesis engines such as Buildgates® available from, inter alia, Cadence Design Systems, Inc., may be used. IEEE std. 1076.3-1997, IEEE Standard VHDL Synthesis Packages, describe an industry-accepted language for specifying a Hardware Definition Language-based design and the synthesis capabilities that may be expected to be available to one of ordinary skill in the art.

Overview

The present invention overcomes the limitations associated with prior art non-optimized and non-compressed instruction sets, and provides users with the additional benefit of tailoring the instruction set to be specific with regard to both their application and the specific programming language employed. Optimal instruction set encoding using a compressed instruction encoding of the base instruction set (i.e., the set of instructions of the core processor less any optional or user configured instructions) is used by the present invention to reduce the code size of programs. The compressed instruction set is in addition to the base instruction set of the processor (such as the ARC™ user-customizable processors supplied by the Applicant herein), although it will be recognized that the compressed instruction set(s) described herein may also constitute a partial or complete replacement for the base instruction set. Compressed and base instruction sets are further combined to achieve flexibility in software coding while providing a high density representation for the majority of the program.

The compressed instruction encoding of the present invention satisfies the foregoing needs, and provides the following attributes: (i) reduces code size; (ii) avoids processor 32/16-bit mode changing; (iii) fairly simple decode (hardware limits on number of gates and processor speed); (iv) small performance loss; (v) exceptions, interrupts and call/return function normally; (vi) no reduction in program address range; and (vii) minimal use of extension instruction slots.

(i) Code Size Reduction—The compression obtained depends at least in part on the application code size and how much instruction space is allocated to the compressed instruction. For example, in the case of the exemplary unpaired eight (8) instruction slot method described subsequently herein, the compression achieved by the Assignee hereof was on the order of 25–30%. For the paired two (2) instruction slot method, the compression achieved was on the order of 15–25%.

(ii) 32/16-bit Mode Changing—In the invention described herein, no processor mode switching is required between pure 32-bit instruction mode execution and pure 16-bit instruction mode execution. This attribute is driven by the need to freely intermix the 32-bit and 16-bit instructions by virtue of the instruction size being encoded in the instruction.

(iii) Simplified Decode—This attribute results from the need to balance the compressed instruction decode logic complexity with the hardware cost of increased gate count and increased power requirements (and increased manufacturing cost associated therewith) and a decrease in clock frequency. Accordingly, the decode logic used in the present invention to decode the compressed instructions strikes an optimal balance between these competing factors.

(iv) Comparatively Small Performance Loss—Overall performance loss resulting from reduced clock frequency through the extra hardware added to support the code compression; and increase in the number of unused clock cycles by the compressed instructions (e.g., unused delay slots that would otherwise be used by the non-compressed analogs of the compressed instructions). This reduction in performance is purposely minimized; i.e., on the order of 10% or less, although even smaller performance reductions may be dictated during design.

(v) Normal Function of Exceptions/Interrupts and Call/Return—The present invention advantageously does not affect the operation of exceptions, interrupts, or call/return operations, thereby making integration of the compressed instruction set into existing designs transparent in that regard.

(vi) Program Address Range—The present invention imposes no reduction on program address range, in that it requires no use of one or more program address bits or other such means to select between compressed and non-compressed instruction execution. This provides the maximum degree of flexibility to the designer/programmer, since no address bits are used, and a broader range of addresses is available.

(vii) Minimal Use of Extension Instruction Slots—In order to maximize the availability of unused processor extension instruction slots for other functions within the core, the compressed code of the present invention makes only minimal use of such slots.

Method Of Optimization

Referring now to FIG. 1, one exemplary embodiment of the generalized method of optimizing an instruction set according to the present invention is described. It will be recognized that while the following discussion is cast in terms of scripts acting on assembly language source code derived from a high-level language (e.g. C/C++) compiler of the type well known in the programming arts, other approaches may be substituted. For example, the same analysis may be performed on a similar binary or hexadecimal encoding of assembly language.

In the first step 102 of the method 100, an assembly language program to be subjected to the optimization process is obtained. Assembly language programs adapted for use on digital processors are well known in the computer arts, and will not be described further herein. Next, in step 104, the static frequency of each instruction type from the base instruction set is determined. As used herein the term "static" refers to a simple count of each instruction type as it exists in the program. The static count is in contrast to the dynamic number of instructions, which refers to the number of times each instruction is executed during a typical execution of the program, which is typically (but not necessarily) different. Furthermore, the term "base instruction set" refers to the core set of instructions of the core processor less any optional or user configured instructions. The static and dynamic counts may be accomplished in any number of different ways readily apparent to those of ordinary skill. Appendix II provides one exemplary script for analyzing a processor (e.g., ARCTM) assembler file and printing the frequency of usage statistics for various processor instruction formats.

Next, in step 106, the instruction types are sorted by frequency of occurrence as determined in step 104. The number and type of instructions necessary for correct program execution are next determined in step 108. If the instructions can be reduced to a power of 2 that is smaller than that of the full instruction set, then the issue is one of whether or not the instruction set can be reduced by a further factor of 2. The ultimate determination is made by calculating the program size using the proposed new instruction set. If the size is sufficiently small, the compressed instruction set is selected. Criteria used to evaluate the sufficiency of the size of the proposed instruction set can include, for example, (i) the fixed memory requirements of the application (e.g., 128 kilobyte code ROM), or (ii) a code-size change threshold between instruction set iterations (e.g., code size change between iterations less than a certain percentage). Other criteria may be used in place or in conjunction with the foregoing, however, depending on the particular application under evaluation.

A compressed instruction set encoding is next created in step 110 by selecting the 'N' instructions with the highest frequency that permit the test program to be compiled with the desired size. The selection of the N instructions depend specifically upon the maximum number of compressed instructions that are allowed by the processor instruction set architecture (ISA). Some instruction formats may be fixed, while others may have a selectable immediate size.

The compressed instruction set of step 110 is then re-evaluated in step 112 using the method of steps 104 through 110. Lastly, in step 114, an instruction set encoding for the compressed instruction set is generated.

Figure 2:
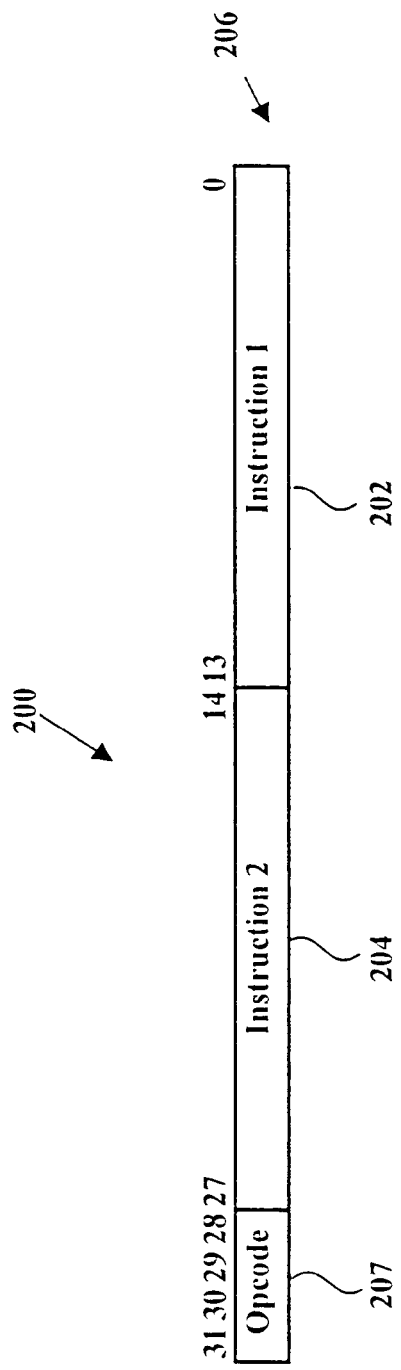
FIG. 2 is a graphical representation of one exemplary encoding structure according to the invention, comprising a "compressed paired instruction" op-code and two compressed 14-bit instructions.

FIG. 2 illustrates one exemplary compressed encoding structure 200 using the core instruction set from a pipelined RISC processor (i.e., the ARC™ core produced by the Applicant herein). The instruction structure was constrained to only use 2 extension instruction slots, as only 2 slots are currently available in the aforementioned processor architecture. It will be appreciated, however, that other numbers of instruction slots and encoding structures may be used as compatible with the host processor's architecture. See, for example, the discussion relating to Table 1 herein.

The encoding structure 200 of FIG. 2 comprises encoding two 14-bit compressed instructions 202, 204, within an aligned 32-bit instruction word 206 having an opcode 207 in the last 4-bits of the 32-bit instruction word 206. The compressed 14-bit instructions 202, 204 of the instruction word 206 use the most frequent statically occurring instructions only. They also utilize a reduced register range (e.g., 8 regs: r0–r4, r13–r16 vs. 32 or 64 registers), and implied registers (e.g., blink, sp, gp, fp). This approach advantageously reduces the number of bits needed to encode a register from 5 or 6 bits down to only 3 bits (or zero bits for implied). As used herein, the term "implied" register refers to registers that are used by an instruction but not specified in the instruction encoding.

Furthermore, the compressed instructions 202, 204 of the illustrated embodiment mostly only specify 2 operands (i.e., "destructive" two-operand instructions where the destination register and a source register are the same). A reduced conditional branch range (8-bit) is also used. The instructions 202, 204 use no branch delay slot execution modes and allow no conditional execution, thereby simplifying their implementation. No flag setting option is available; rather the flags are always set by the instructions.

Figure 3:
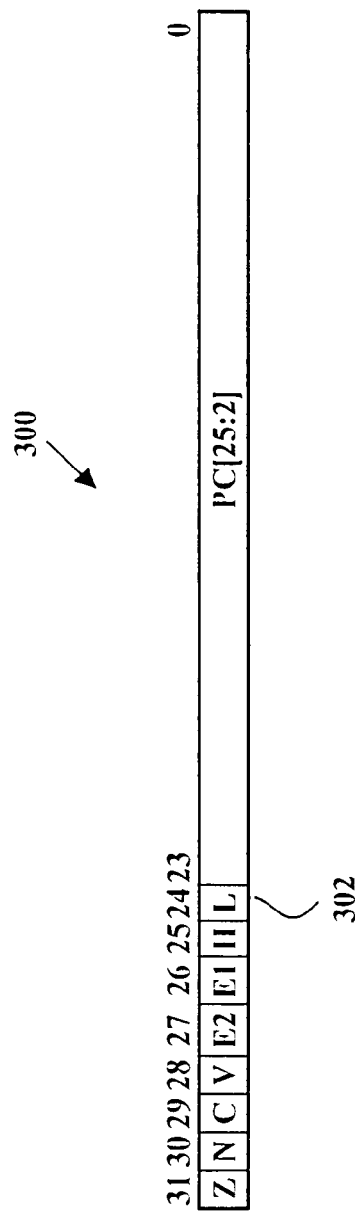
FIG. 3 is a graphical representation of one exemplary PC/Status register structure used in conjunction with the present invention, wherein a single bit ("L-bit") is used to indicate which of the pair of compressed instructions is to be executed (e.g. instruction 1 or instruction 2).
Figure 28:
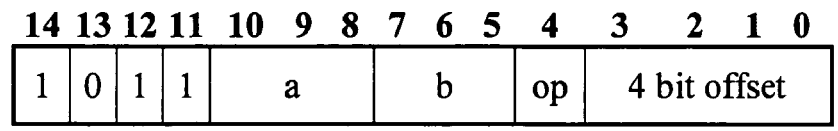
FIG. 28 is a graphical representation of an exemplary 4-bit offset, 15-bit STB/ STW instruction encoding according to the invention.
Figure 29:
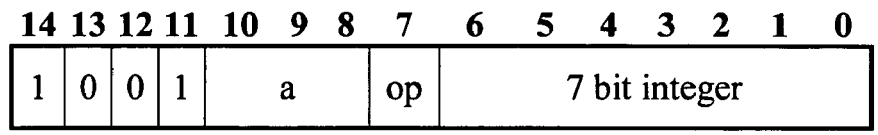
FIG. 29 is a graphical representation of an exemplary 7-bit integer, 15-bit LOAD instruction encoding according to the invention.
Figure 30:
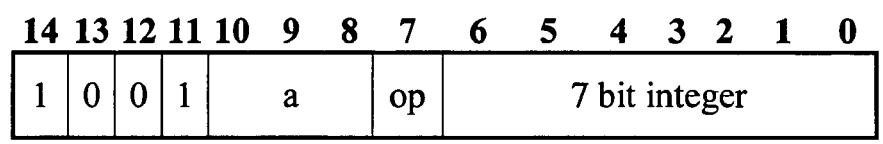
FIG. 30 is a graphical representation of an exemplary 7-bit integer, 15-bit ADD instruction encoding according to the invention.
Figure 31:
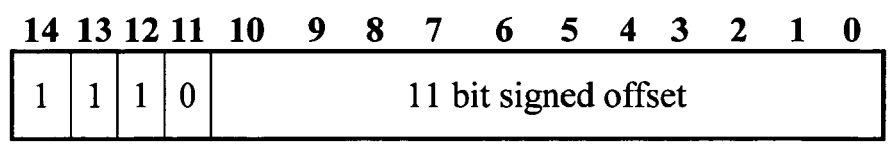
FIG. 31 is a graphical representation of an exemplary 11-bit signed offset branch-and-link, 15-bit instruction encoding according to the invention.
Figure 32:
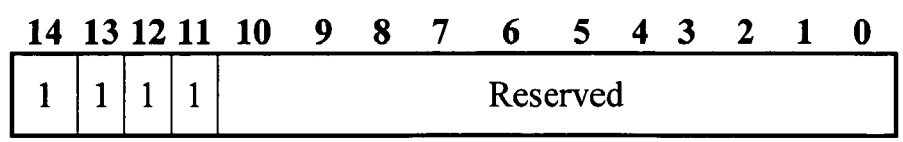
FIG. 32 is a graphical representation of an exemplary 15-bit instruction encoding reserved for future expansion according to the invention.

FIG. 3 illustrates one embodiment of the structure 300 of a status register used within the processor to indicate whether the high/low compressed instruction 202, 204 is being executed. Specifically, one bit (the "L bit") 302 indicates the selected compressed instruction 202, 204 (i.e., "0" or "1"). This register structure 300 allows the 32-bit jumps, interrupts and branch-and-links to function normally, yet can make dynamic jump calculation somewhat more complicated since the L bit should be before bit 0. Specifically, for the unpaired compressed instruction format, the complexity arises from the low address bit (L) being in the wrong bit position for a simple address calculation. For example, consider the following PC register format:

| bit 24, L bit | bits 23-0, PC address bits (32-bit aligned) |
|---|---|

A simpler register format enabling easy dynamic jump address calculation would be to make the L bit the least significant bit, as follows:

| bits 24-1, PC address bits (32-bit aligned) | bit 0, L-bit |
|---|---|

For the paired compressed instruction format, the address calculation is somewhat complicated by having to perform a "logical-or" operation in the correct target address compressed instruction high/low selection bit (L). The simpler register format which repositions the L-bit as shown above does not provide any benefit in this case.

It is noted that greater compression is possible through the use of (i) more instruction slots allowing more bits per compressed instruction, and (ii) independent single 16-bit instruction words (i.e., "single" format; no need to pair as in the preceding examples). Table 1 illustrates this relationship:

TABLE 1

| Instruction slots used | Paired format (32 bit) | Single format (16 bit) |
|---|---|---|
| 2 (4 opcode bits) | 2 × 14 bits | 1 × 12 bits |
| 4 (3 opcode bits) | (not possible) | 1 × 13 bits |
| 8 (2 opcode bits) | 2 × 15 bits | 1 × 14 bits |

Note that a paired format is not possible in the 4 instruction slot case listed in Table 1 above, as there are an odd number of bits left to divide between the two instructions (e.g., 32 bits−3 bits=29 bits, which does not produce a whole number when divided by two).

Note that for the paired instruction format, only a moderate level of compression (approx. 15–25%) is achieved, using fetch-aligned 32 bit instructions. This format, however, has the advantage of utilizing only two instruction slots, thereby making a maximum number of unused slots available for other purposes. In contrast, the single instruction format achieves a higher level of instruction set compression (approx. 20–30%) using fetch-unaligned 32 bit instructions, at the price, however, of using more slots.

In one embodiment of the compressed encoding of the invention, the compressed ISA uses only three bits for register encoding. In another embodiment, four bits are utilized. Note, however, that the use of 4 bits for register encoding would reduce the number of opcodes possible and the size of immediate data.

The most frequently used registers, i.e., those registers most frequently statically referenced by instructions, are r0–r3 (ABI argument regs.) and r13-r16 (ABI saved registers). Table 2 illustrates the compressed instruction set architecture (ISA) 3-bit register encodings according to the present invention. Table 4 illustrates an alternate 4-bit register encoding.

TABLE 2

| 3-bit Compressed ISA register encoding | 32-bit ISA register |
|---|---|
| 0 | R0 |
| 1 | R1 |
| 2 | R2 |
| 3 | R3 |
| 4 | R13 |
| 5 | R14 |
| 6 | R15 |
| 7 | R16 |

TABLE 3

| 4-bit Compressed ISA register encoding | 32-bit ISA register |
|---|---|
| 0 | R0 |
| 1 | R1 |
| 2 | R2 |
| 3 | R3 |
| 4 | R4 |
| 5 | R5 |
| 6 | R6 |
| 7 | R7 |
| 8 | R8 |
| 9 | R9 |
| 10 | R10 |
| 11 | R11 |
| 12 | R12 |
| 13 | R13 |
| 14 | R14 |
| 15 | R15 |

FIGS. 4–13 illustrate exemplary ISA1 14-bit instruction encodings according to the invention. FIGS. 15–32 illustrate alternative (ISA2) 15-bit instruction encodings. Table 4 below provides a key for the symbology used in FIGS. 4–32.

TABLE 4

| Symbol | Meaning |
|---|---|
| a | destination and source register (r0–r3, r13–r16) |
| b | source register (r0–r3, r13–r16) |
| c | source register (r0–r3, r13–r16) |
| cc | condition code (al/eq/ne/lt/le/gt/ge/pnz) |
| h | high register access (r0–r31) |
| op | Opcode |
| s7 | signed 7-bit integer |
| u5 | unsigned 5-bit integer |

The exemplary encodings of FIGS. 4–32 advantageously provide faster and simpler instruction decode, since all of the major instruction opcodes are encoded within the top five bits (i.e., the major opcode bits). The major opcode bits determine the format of the rest of the instruction bits (e.g. whether it is a 32 or 16-bit instruction, where the source/destination register fields are, where the immediate data field is, etc.). Within the selectetd instruction format there may be further opcode bits.

Furthermore, almost all instruction formats have the source register fields located in the same position (i.e., bits 5–7). All of the various sized immediate data fields start from the least significant bit, thereby further enhancing extraction.

The most frequent compressible instruction functions associated with the exemplary ARC core previously referenced herein include the MOVE (mov), LOAD (ld [reg+offset]), COMPARE (cmp), BRANCH (bcc), STORE (st [reg+offset]), and ADD (add). It will be recognized, however, that the general methods of the present invention may readily be applied to other instructions and ISAs.

Bcc Offset

Offset is a signed word aligned offset. cc is the condition. All possible 16 base case conditions could be allowed if a shorter 7-bit range used. BAL ("Branch Always") may be special format with longer range.

LD/LDB/LDW a,[b,u4] /ST/BSTW a,[b,u3]—The primary use of these LOAD/STORE instructions is for data structure access. The 3- or 4-bit unsigned offset is shifted left as required by the data access alignment (e.g. 2 for long word access, 1 for word access and 0 for byte access). This means that structure elements should be designed so that the most frequently accessed items are within the 16 byte offset range for byte accesses, 32 byte offset range for aligned word accesses and 64 byte offset range for aligned long word accesses.

LD/ST a,[gp, s7]—Global small data area long word aligned LOAD/STORE access. If a compiled program does not make optimal use of this global variable area, then these instruction slots are wasted. The signed 7-bit offset is a long word aligned offset which is selected so that it can access the whole of the current 512 byte global small data area.

MOV/CMP a,u7—This type of instruction occurs very frequently in the above referenced application. Note that the size of immediate data can be reduced to 5 or 6 bits to allow more room for other opcodes. CMP is a special encoding of SUB.F 0,a,u7 with no destination register.

op a,a,b—Frequent ops. NEG is a special encoding of "SUB.F a,0,b". NOT is a special encoding of "XOR.F a, b, −1".

"Single_ops" is used to encode single source register operand instructions using the b field as a sub-opcode.

Frequent implied operand instructions may be encoded off of one of the single_op "op a,b" slots, using the a field as the sub-opcode when b=7. For example:

st blink,[sp, 4]??; push blink to stack on function call entry
    j[blink]; return from function call
    brk; breakpoint op a,a,u5—Immediate shifts (NB shifts by more than one bit are extension instructions). ADD/SUB with immediate data occurs very frequently. CMP is a special encoding of "SUB.F 0,a,b" with no destination register.

MOV.F a, h/ MOV.F h,a/CMP a, h/ CMP h,a/ADD.F a, h/ ADD.F h,a—h is a register in the range r0–r31. It is important in this context to have MOVE/CMP/ADD able to access to all base case registers r0–r31.

Appendix I describes one possible compressed instruction set encoding that is produced as a result of running the scripts in Appendix II–VII and following the method of synthesis.

Appendices II and III provides an exemplary script for analyzing a processor (e.g., ARC™) assembler file and printing the frequency of usage statistics for various existing and proposed processor instruction formats.

Appendix IV provides an exemplary script for marking pairs of compressed instructions for a processor assembler file.

Appendix V provides an exemplary script for printing the paired ISA format compression ratio. The script is called from a ".bat" (batch) command script to calculate the compression ratio (CR):

$$CR = n_c/n_t \quad \text{(Eqn. 2)}$$

where:
    $n_c$=number of compressed instructions
    $n_t$=total number of original (uncompressed) instructions Appendices VI and VII provide exemplary script to generate a report on analysis of an ARC assembler file.

Appendix VIII provides an exemplary script for printing a report for usage of specified processor instruction formats from an ISA file and a processor assembler file.

Appendices IX and X provide exemplary script to strip out more non-instruction lines from an ARC assembler file.

Appendix XI provides an exemplary script for moving instructions that are in a branch delay slot to before the branch instruction and removing the delay slot mode syntax from the branch instruction of a processor. The syntax is removed since the compressed branch instructions of the illustrated embodiment have only one delay slot mode (i.e., .nd=no delay slot).

Appendix XII provides an exemplary set of instruction formats according to the present invention.

Method of Synthesizing

Figure 33:
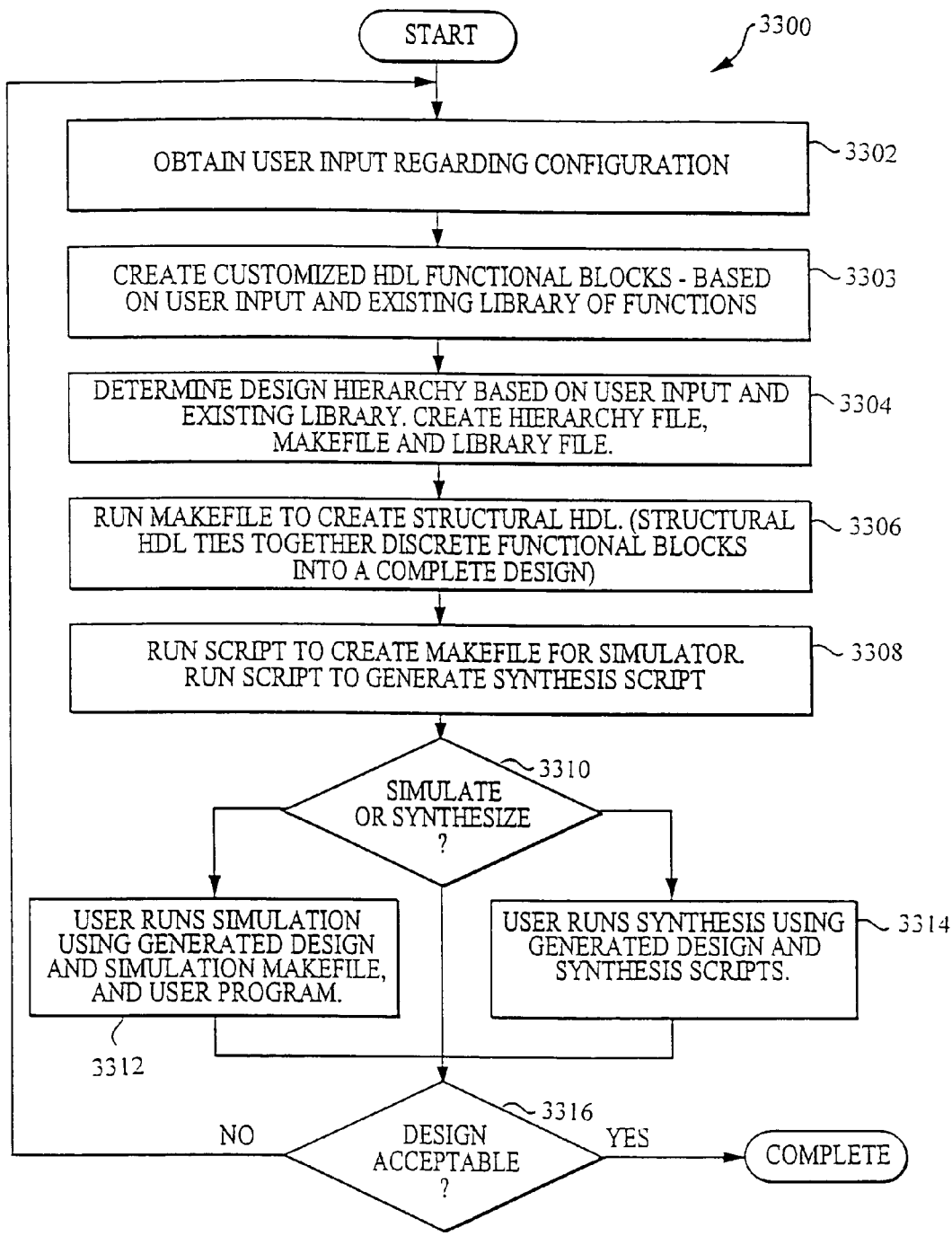
FIG. 33 is a logical flow diagram illustrating the generalized methodology of synthesizing processor logic which incorporates the compressed instruction set and instruction coding of the present invention.

Referring now to FIG. 33, the method 3300 of synthesizing a processor design incorporating the compressed instruction set previously discussed is described. The generalized method of synthesizing integrated circuits having a user-customized (i.e., "soft") instruction set is disclosed in Applicant's co-pending U.S. patent application Ser. No. 09/418,663 entitled "Method And Apparatus For Managing The Configuration And Functionality Of A Semiconductor Design" filed Oct. 14, 1999, now U.S. Pat. No. 6,862,563, which is incorporated herein by reference in its entirety.

While the following description is presented in terms of an algorithm or computer program running on a microcomputer or other similar processing device, it can be appreciated that other hardware environments (including minicomputers, workstations, networked computers, "supercomputers", and mainframes) may be used to practice the method. Additionally, one or more portions of the computer program may be embodied in hardware or firmware as opposed to software if desired, such alternate embodiments being well within the skill of the computer artisan.

Initially, user input is obtained regarding the design configuration in the first step 3302. Specifically, desired modules or functions for the design are selected by the user, and instructions relating to the design are added, subtracted, or generated as necessary. For example, in signal processing applications, it is often advantageous for CPUs to include a single "multiply and accumulate" (MAC) instruction. In the present invention, the instruction set of the synthesized design is modified so as to incorporate the foregoing instruction set compression (or other comparable compression techniques) therein.

The technology library location for each VHDL file is also defined by the user in step 3302. The technology library files in the present invention store all of the information related to cells necessary for the synthesis process, including for example logical function, input/output timing, and any associated constraints. In the present invention, each user can define his/her own library name and location(s), thereby adding further flexibility.

Next, in step 3303, the user creates customized HDL functional blocks based on the user's input and the existing library of functions specified in step 3302.

In step 3304, the design hierarchy is determined based on user input and the aforementioned library files. A hierarchy file, new library file, and makefile are subsequently generated based on the design hierarchy. The term "makefile" as used herein refers to the commonly used UNIX makefile function or similar function of a computer system well known to those of skill in the computer programming arts. The makefile function causes other programs or algorithms resident in the computer system to be executed in the specified order. In addition, it further specifies the names or locations of data files and other information necessary to the successful operation of the specified programs. It is noted, however, that the invention disclosed herein may utilize file structures other than the "makefile" type to produce the desired functionality.

In one embodiment of the makefile generation process of the present invention, the user is interactively asked via display prompts to input information relating to the desired design such as the type of "build" (e.g., overall device or system configuration), width of the external memory system data bus, different types of extensions, cache type/size, etc. Many other configurations and sources of input information may be used, however, consistent with the invention.

In step 3306, the user runs the makefile generated in step 3304 to create the structural HDL. This structural HDL ties the discrete functional block in the design together so as to make a complete design.

Next, in step 3308, the script generated in step 3306 is run to create a makefile for the simulator. The user also runs the script to generate a synthesis script in step 3308.

At this point in the program, a decision is made whether to synthesize or simulate the design (step 3310). If simulation is chosen, the user runs the simulation using the generated design and simulation makefile (and user program) in step 3312. Alternatively, if synthesis is chosen, the user runs the synthesis using the synthesis script(s) and generated design in step 3314. After completion of the synthesis/simulation scripts, the adequacy of the design is evaluated in step 3316. For example, a synthesis engine may create a specific physical layout of the design that meets the performance criteria of the overall design process yet does not meet the die size requirements. In this case, the designer will make changes to the control files, libraries, or other elements that can affect the die size. The resulting set of design information is then used to re-run the synthesis script.

If the generated design is acceptable, the design process is completed. If the design is not acceptable, the process steps beginning with step 3302 are re-performed until an acceptable design is achieved. In this fashion, the method 3300 is iterative.

Figure 34:
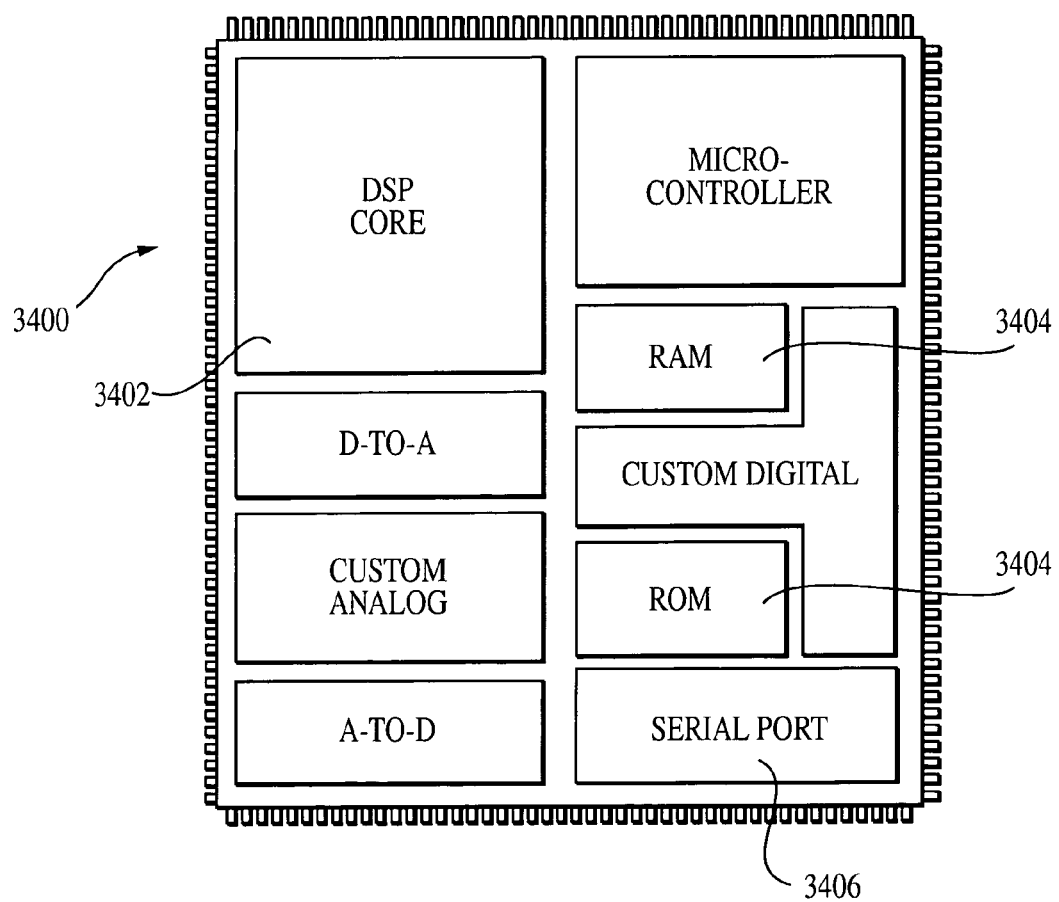
FIG. 34 is a block diagram of a pipelined processor design incorporating the compressed instruction set and instruction coding of the present invention.

FIG. 34 illustrates an exemplary pipelined processor fabricated using a 1.0 um process and incorporating the aforementioned compressed instruction set. As shown in FIG. 34, the processor 3400 is an ARC microprocessor-like CPU device having, inter alia, a processor core 3402, on-chip memory 3404 (including program memory), and an external interface 3406. The device is fabricated using the customized VHDL design obtained using the method 3300 of the present invention, which is subsequently synthesized into a logic level representation, and then reduced to a physical device using compilation, layout and fabrication techniques well known in the semiconductor arts.

It will be appreciated by one skilled in the art that the processor of FIG. 34 may contain any commonly available peripheral such as serial communications devices, parallel ports, timers, counters, high current drivers, analog to digital (A/D) converters, digital to analog converters (D/A), interrupt processors, LCD drivers, memories and other similar devices. Further, the processor may also include custom or application specific circuitry. The present invention is not limited to the type, number or complexity of peripherals and other circuitry that may be combined using the method and apparatus. Rather, any limitations are imposed by the physical capacity of the extant semiconductor processes which improve over time. Therefore it is anticipated that the complexity and degree of integration possible employing the present invention will further increase as semiconductor processes improve.

It is also noted that many IC designs currently use a microprocessor core and a DSP core. The DSP however, might only be required for a limited number of DSP functions, or for the IC's fast DMA architecture. The invention disclosed herein can support many DSP instruction functions, and its fast local RAM system gives immediate access to data. Appreciable cost savings may be realized by using the methods disclosed herein for both the CPU & DSP functions of the IC.

Additionally, it will be noted that the methodology (and associated computer program) as previously described herein can readily be adapted to newer manufacturing technologies with a comparatively simple re-synthesis instead of the lengthy and expensive process typically required to adapt such technologies using "hard" macro prior art systems. For example, the present invention is compatible with 0.35, 0.18, and 0.1 micron processes, and ultimately may be applied to processes of even smaller or other resolution. An exemplary process for fabrication of the device is the 0.1 micron "Blue Logic" Cu-11 process offered by International Business Machines Corporation, although others may be used.

Figure 35:
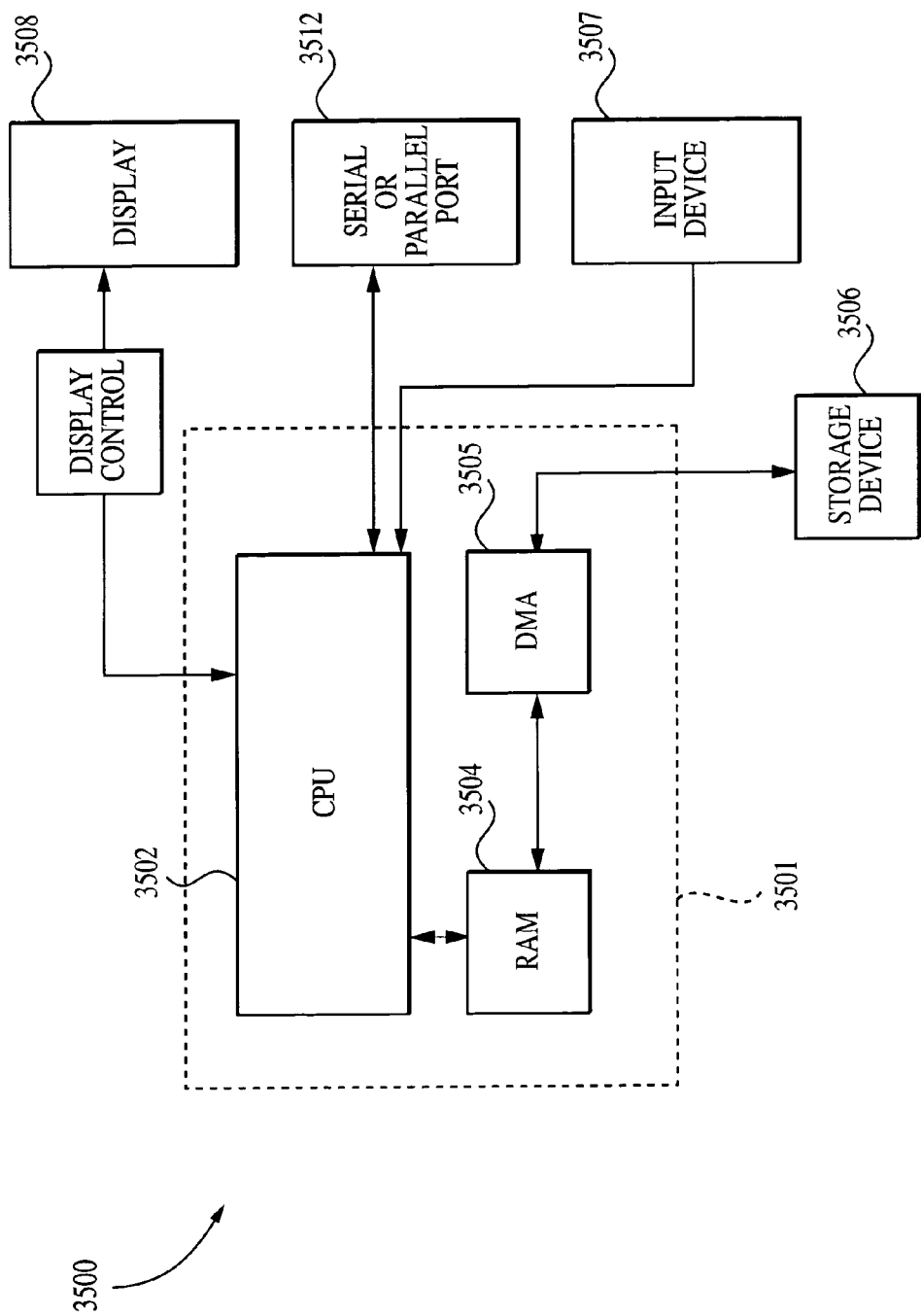
FIG. 35 is a functional block diagram of one exemplary embodiment of a computer system useful for synthesizing a processor design incorporating the compressed instruction set and instruction coding of the invention.

Referring now to FIG. 35, one embodiment of a computing device capable of synthesizing compressed instruction set processor designs using the methodology discussed with respect to FIG. 33 herein is described. The computing device 3500 comprises a motherboard 3501 having a central processing unit (CPU) 3502, random access memory (RAM) 3504, and memory controller 3505. A storage device 3506 (such as a hard disk drive or CD-ROM), input device 3507 (such as a keyboard or mouse), and display device 3508 (such as a CRT, plasma, or TFT display), as well as buses necessary to support the operation of the host and peripheral components, are also provided. The aforementioned VHDL descriptions and synthesis engine are stored in the form of an object code representation of a computer program in the RAM 3504 and/or storage device 3506 for use by the CPU 3502 during design synthesis, the latter being well known in the computing arts. The user (not shown) synthesizes logic designs by inputting design configuration specifications into the synthesis program via the program displays and the input device 3507 during system operation. Synthesized designs generated by the program are stored in the storage device 3506 for later retrieval, displayed on the graphic display device 3508, or output to an external device such as a printer, data storage unit, other peripheral component via a serial or parallel port 3512 if desired.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

I claim:

1. A method of optimizing the instruction set of a digital processor having a mixed 16-bit and 32-bit instruction set architecture, comprising:
   (i) providing a program having a plurality of different instruction types, individual ones of said instruction types being included within at least one of 16-bit and 32-bit instruction words;
   (ii) determining the static frequency of each of said instruction types from a base instruction set;
   (iii) determining the number and type of instructions necessary for correct instruction set execution based at least in part on said act of determining the static frequency; and
   (iv) creating a compressed instruction set encoding to generate a compressed instruction set based at least in part on said act of determining;
   wherein said act of creating a compressed instruction set comprises creating at least one compressed 14-bit instruction disposed within one of said 16-bit or 32 bit words.

2. The method of claim 1, further comprising:
re-evaluating said compressed instruction set using at least said steps (i), (ii), and (iii); and
generating an instruction set encoding for said compressed instruction set.

3. The method of claim 1, wherein the act of providing a program comprises providing an assembly language program.

4. The method of claim 3, further comprising sorting said instruction types by frequency of usage.

5. The method of claim 4, wherein said digital processor includes an extension logic unit adapted to execute at least one extension instruction, and the act of providing comprises providing a program having said at least one extension instruction, said at least one execution instruction being executable by said extension logic unit.

6. The method of claim 1, wherein the act of creating a compressed instruction set comprises selecting "N" instructions having the greatest frequency of occurrence, said selected "N" instructions permitting said program to be compiled with a predetermined size.

7. The method of claim 6, further comprising the act of determining a compression ratio for said compressed instruction set, said compression ratio being related to the ratio of the number of compressed instructions to the total number of original instructions.

8. The method of claim 1, wherein said at least one compressed 14-bit instruction comprises a register-register multi-use opcode 14-bit instruction encoding comprising a 5-bit op-code, and two 3-bit fields.

9. The method of claim 1, wherein said at least one compressed 14-bit instruction comprises a compressed paired-instruction op-code, and two compressed 14-bit instructions.

10. An application specific integrated circuit (ASIC), comprising:
a first processor core, said processor core having a pipeline with at least instruction fetch, decode, and execute stages associated therewith;
an optimized instruction set comprising a base instruction set and a compressed instruction set, said compressed instruction set having a predetermined number and type of instructions, said predetermined number and type based at least in part on the static frequency of occurrence of instructions within said base instruction set, said optimized instruction set further comprising at least one extension instruction adapted to perform at least one specific operation;
at least one storage device adapted to store a plurality of data bytes therein, said at least one storage device being accessible by said first processor core; and
at least one extension logic unit adapted to facilitate execution of said at least one execution instruction;
wherein said processor core is adapted to execute both 16-bit and 32-bit instructions without processor mode switching; and
further wherein said pipeline is operative to utilize said optimized instruction set without instruction translation.

11. The ASIC of claim 10, further comprising a second processor core, said second processor core being disposed on the same die as said first processor core.

12. The ASIC of claim 11, wherein said second processor core comprises a digital signal processor (DSP), said DSP being adapted to perform at least one operation on data provided to said ASIC.

13. The ASIC of claim 12, wherein said DSP is adapted for initiation by an instruction from said first processor core.

14. The ASIC of claim 12, wherein at least a portion of the operation of said DSP is controlled by extension registers associated with said first processor core.

15. A method of operating an extended pipelined digital processor having an instruction pipeline comprising at least instruction fetch, decode, and execute stages, a storage device configured to hold a plurality of program instructions, and an optimized instruction set, the method comprising:
providing a base instruction set having a plurality of 16-bit and 32-bit instructions;
providing an extension instruction set determined at least in part by selections made by a user;
providing a compressed instruction set derived at least in part from said base and extension instruction sets;
assigning one of a plurality of predetermined values to at least one bit within a status register within said processor;
executing at least one instruction from said base instruction set within said pipeline based on a first predetermined value present in said status register; and
executing at least one instruction from said compressed instruction set within said pipeline based on a second predetermined value present in said status register;
wherein 16-bit instructions from said plurality of 16-bit and 32-bit instructions are processed as 16-bit instructions, and 32-bit instructions from said plurality of 16-bit and 32-bit instructions are processed as 32-bit instructions.

16. The method of claim 15, wherein the act of assigning comprises assigning a "1" or "0" value to a low address (L) bit within said register.

17. The method of claim 16, wherein the act of providing a compressed instruction set comprises encoding at least a portion of the instruction operation codes (opcodes) for the compressed instructions within a predetermined number of the most significant bits of an instruction word.

18. The method of claim 16, wherein the act of providing a compressed instruction set further comprises encoding a plurality of said compressed instructions with source register fields located in a predetermined relationship to one another within said compressed instructions.

19. The method of claim 18, wherein the act of encoding with said predetermined relationship comprises encoding the source register fields for respective ones of said plurality of compressed instructions at identical locations.

20. The method of claim 15, wherein the act of providing a compressed instruction set comprises encoding all of the immediate data fields such that they start from the least significant bit (LSB).

21. A user-configured and extended pipelined RISC processor, comprising:
a processor core having an instruction pipeline comprising at least instruction fetch, decode, and execute stages;
a data interface in data communication with said processor core, said interface adapted for data communication with a storage device configured to hold a plurality of program instructions; and
an optimized instruction set comprising a base instruction set and a compressed instruction set, said compressed instruction set being generated by the method comprising:
determining the static frequency of each of a plurality of instruction types from said base instruction set;

determining the number and type of instructions necessary for instruction set execution based at least in part on said act of determining the static frequency; and creating a compressed instruction set encoding to generate said compressed instruction set, said creating comprising using an encoding structure having an opcode and two instruction slots, each of said slots having two 14-bit instructions, and selecting two instructions having the greatest frequency of occurrence, said selected two instructions permitting said program to be compiled with a predetermined size;

wherein any immediate data fields in said compressed instruction set start from the least significant bit of respective ones of said instructions; and wherein a plurality of instructions from said compressed instruction set each have at least one source register field located in common location therein.

22. The processor of claim 21, wherein said structure comprises a 32-bit encoding structure with said opcode disposed within the last four bits thereof.

23. A user-configured and extended pipelined RISC processor, comprising:

a processor core having an instruction pipeline comprising at least instruction fetch, decode, and execute stages;

a data interface in data communication with said processor core, said interface adapted for data communication with a storage device configured to hold a plurality of program instructions; and an optimized instruction set comprising a base instruction set and a compressed instruction set, said compressed instruction set being generated by the method comprising:

determining the static frequency of each of said instruction types from said base instruction set;

determining the number and type of instructions necessary for instruction set execution based at least in part on said act of determining the static frequency; and creating a compressed instruction set encoding to generate said compressed instruction set, said creating comprising using a 32-bit encoding structure having an opcode and a plurality of instruction slots, said opcode being disposed within at least the last 4-bits of said structure, and selecting a corresponding number of instructions having the greatest frequency of occurrence, said selected instructions permitting said program to be compiled with a predetermined size;

wherein both said user-extension and configuration of said processor are performed as part of generating of a description language model of said processor; and wherein only a subset of available registers, and implied registers, are used by said compressed instruction set, said subset and implied registers reducing the number of bits required to encode a register.

24. A method of operating a user-extended and configured RISC processor having an instruction pipeline comprising at least instruction fetch, decode, and execute stages, a storage device configured to hold a plurality of program instructions, and an optimized instruction set, the method comprising:

providing a base instruction set having a plurality of instructions and an extension instruction set having at least one extension instruction;

providing a compressed instruction set derived at least in part from said base instruction set;

assigning a value to a compressed instruction selection bit within a status register within said processor;

executing at least one instruction from said base instruction set within said pipeline based on a first predetermined value present in said status register; and executing at least one instruction from said compressed instruction set within said pipeline based on said assigned value of said compressed instruction selection bit in said status register, wherein instructions from said set of compressed instructions are executed directly without translation.

25. The method of claim 24, wherein the act of providing a compressed instruction set comprises encoding at least a portion of the instruction operation codes (opcodes) for the compressed instructions within a predetermined number of the most significant bits of an instruction word.

26. The method of claim 25, wherein the act of providing a compressed instruction set further comprises encoding a plurality of said compressed instructions with source register fields located in a predetermined relationship to one another.

27. The method of claim 26, wherein the act of encoding with said predetermined relationship comprises encoding the source register fields for respective ones of said plurality of compressed instructions at identical locations.

28. The method of claim 24, wherein the act of providing a compressed instruction set comprises encoding all of the immediate data fields such that they start from the least significant bit (LSB).

29. A method of operating an extended pipe lined digital RISC processor having an instruction pipeline comprising at least instruction fetch, decode, and execute stages, a storage device configured to hold a plurality of program instructions, and an optimized instruction set comprising both 16-bit and 32-bit instructions, the method comprising:

providing an extension instruction set having a plurality of user-selected extension instructions;

providing a compressed instruction set derived at least in part from said extension instruction set;

encoding a plurality of compressed instructions from said compressed instruction set into an instruction word having an op-code;

assigning one of a plurality of predetermined values to at least one bit within a status register within said processor; and executing at least one of said compressed instructions from said instruction word within said pipeline based on a second predetermined value present in said status register;

wherein a majority of instruction opcodes are encoded within the top n bits, n being an integer greater than 1, said top n bits determining the format of the remaining bits within an instruction associated therewith.

30. The method of claim 29, wherein said act of encoding comprises encoding two 14-bit compressed instructions into a 32-bit aligned instruction word having said opcode disposed within at least the last four bits thereof.

31. A reduced instruction set (RISC) pipelined digital processor, comprising:

a user-configured and user-extended RISC processor core having an instruction pipeline comprising at least instruction fetch, decode, and execute stages;

a data interface in data communication with said processor core, said interface adapted for data communication with a storage device configured to hold a plurality of program instructions; and an optimized instruction set comprising a base instruction set and a compressed instruction set, said compressed instruction set being generated by the method comprising:

determining the static frequency of each of said instruction types from said base instruction set;

determining the number and type of instructions necessary for instruction set execution based at least in part on said act of determining the static frequency; and creating a compressed instruction set encoding to generate said compressed instruction set; and wherein both said user-extension and configuration of said processor core are performed as part of generating of a description language model of said processor core; and wherein instructions from said compressed instruction set are processed in the same form as they are stored in said storage device.

32. The processor of claim 31, wherein said generating of a description language model of said processor core comprises:

receiving one or more inputs from a user for at least one customized parameter of the processor core; and generating through an automated process said description language model based at least in part on the at least one customized parameter, and at least one prototype descriptions and at least one extension logic description.

33. The processor of claim 32, wherein said generating of a description language model of said processor core further comprises generating, via an automated process, test code associated with said model.

34. The processor of claim 32, wherein the description language model includes both functional and structural description language descriptions for the processor core.

35. A RISC microprocessor having a processor core and at least one instruction set operative to run on said core, said at least one instruction set being defined by a plurality of instructions comprising:

a multi-bit offset, 14-bit conditional branch instruction;

a register-register multi-use opcode 14-bit instruction;

a single source register opcode 14-bit instruction;

an implied register opcode 14-bit instruction;

a multi-bit offset, 14-bit Load instruction;

a multi-bit offset, 14-bit Store instruction;

a multi-bit offset, 14-bit LOAD/STORE instruction;

a multi-bit integer, 14-bit MOVE/COMPARE instruction; and a multi-bit integer, 14-bit ADD instruction.

36. A RISC microprocessor having a processor core and at least one instruction set operative to run on said core, said at least one instruction set being defined by a plurality of instructions comprising:

a multi-bit signed offset conditional branch, 15-bit instruction;

a multi-bit register-register multi-use opcode instruction;

a multi-bit single source register opcode instruction;

a multi-bit implied opcode instruction;

a multi-bit offset, 15-bit LOAD instruction;

a multi-bit offset, 15-bit STORE instruction;

a multi-bit offset, 15-bit LOAD/ STORE instruction; and a multi-bit integer, 15-bit MOV/ CMP instruction.

37. The microprocessor of claim 36, wherein said plurality of instructions further comprises:

a 5-bit integer, 15-bit instruction;

a multi-bit MOV.F instruction;

a multi-bit integer, 15-bit ADD/SUB instruction;

a multi-bit integer, 15-bit LOAD instruction;

a multi-bit integer, 15-bit ADD instruction;

a multi-bit signed offset branch-and-link, 15-bit instruction; and a 15-bit instruction reserved for future expansion.

* * * * *